(12) United States Patent
Kwak et al.

(10) Patent No.: US 6,956,418 B2
(45) Date of Patent: Oct. 18, 2005

(54) DELAY LOCKED LOOP DEVICE

(75) Inventors: Jong-Tae Kwak, Ichon-shi (KR); Seong-Hoon Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/749,426

(22) Filed: Dec. 31, 2003

(65) Prior Publication Data

US 2004/0217789 A1 Nov. 4, 2004

(30) Foreign Application Priority Data

Apr. 29, 2003 (KR) .............................. 10-2003-0027016

(51) Int. Cl.[7] ................................................ H03L 7/06
(52) U.S. Cl. ...................................... 327/158; 327/149
(58) Field of Search ................................ 327/158, 149, 327/152, 153, 161, 276, 277, 284

(56) References Cited

U.S. PATENT DOCUMENTS

| | | | | |
|---|---|---|---|---|
| 6,148,038 A | * | 11/2000 | Drost et al. | 375/324 |
| 6,373,301 B1 | * | 4/2002 | Chen et al. | 327/141 |
| 6,388,485 B2 | * | 5/2002 | Kim | 327/161 |
| 6,445,231 B1 | * | 9/2002 | Baker et al. | 327/158 |
| 6,483,871 B1 | * | 11/2002 | Dawe | 375/226 |
| 6,642,760 B1 | * | 11/2003 | Alon et al. | 327/158 |
| 6,677,792 B2 | * | 1/2004 | Kwak | 327/158 |
| 6,680,635 B2 | * | 1/2004 | Lee | 327/158 |
| 6,748,549 B1 | * | 6/2004 | Chao et al. | 713/401 |

* cited by examiner

Primary Examiner—Timothy P. Callahan
Assistant Examiner—Cassandra Cox
(74) Attorney, Agent, or Firm—Blakely Sokoloff Taylor & Zafman

(57) ABSTRACT

A delay locked loop device includes a first delay line for receiving an external clock signal and a first delay control signal to generate a first internal clock signal; a second delay line for receiving the external clock signal and a second delay control signal or the first delay control signal to generate a second internal clock signal; a first delay control block for receiving the external clock signal to generate the first delay control signal; a second delay control block for receiving the external clock signal to generate the second delay control signal; and a phase detecting block for receiving the first internal clock signal and the second internal clock signal to generate the on-off signal by comparing a phase of the first internal clock signal with a phase of the second internal clock signal.

12 Claims, 6 Drawing Sheets

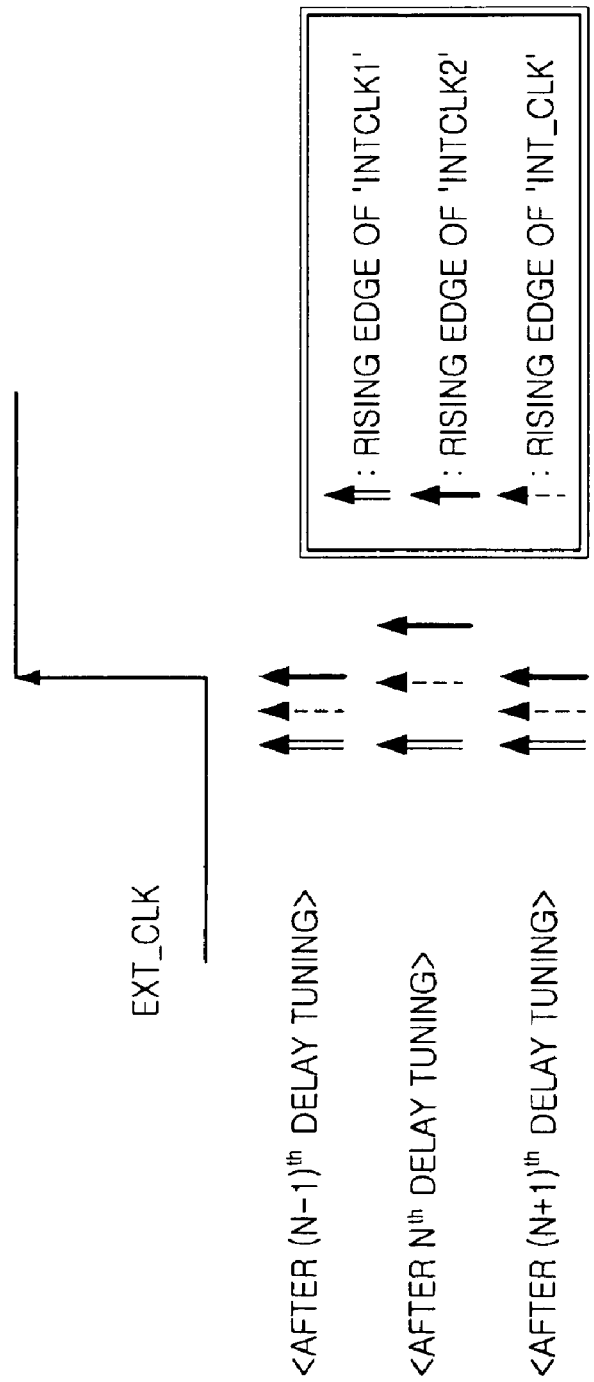

DELAY LOCKED LOOP DEVICE

FIELD OF INVENTION

The present invention relates to a delay locked loop (DLL) device; and, more particularly, to a DLL device which synchronizes an internal clock signal with an external clock signal.

DESCRIPTION OF PRIOR ART

A delay locked loop (DLL) device is used for a synchronous semiconductor memory device to synchronize an internal clock signal with an external clock signal. Since there is a time delay while the external clock is inputted to the synchronous semiconductor memory device, the DLL device is needed for synchronizing the internal clock signal with the external clock signal.

FIG. 1 is a block diagram showing a conventional DLL device disclosed in a commonly owned copending application, U.S. Ser. No. 10/331,412, filed on Dec. 30, 2002, entitled "DIGITAL DLL APPARATUS FOR CORRECTING DUTY CYCLE AND METHOD THEREOF", which is incorporated herein by reference.

The conventional DLL device includes a buffer 110, a delay line unit 120, a duty error control unit 130, a first delay model unit 140, a first direct phase detector 150, a second delay model unit 160 and a second direct phase detector 170.

The buffer 110 receives an external clock signal EXT_CLK to output the inputted external clock signal as an input clock signal CLKI to the delay line unit 120. The delay line unit 120 receives and delays the input clock signal CLKI to output a first clock signal INTCLK1 after comparing a first comparative signal PD1 with the input clock signal CLKI; and to output a second clock signal INTCLK2 after comparing a second comparative signal PD2 with the input clock signal CLKI.

The duty error control unit 130 adjusts the first clock signal INTCLK1 and the second clock signal INTCLK2 by moving a falling edge of the first clock signal INTCLK1 and a falling edge of the second clock signal INTCLK2 into a middle of the two falling edges.

Thereafter, the duty error control unit 130 outputs the adjusted first clock signal as a first mixed clock signal INT_CLK, and outputs the adjusted second clock signal as a second mixed clock signal INTCLK2. The first delay model unit 140 receives the first mixed clock signal INT_CLK and estimates a delay amount generated while the first mixed clock signal INT_CLK travels to a data input/output pin (DQ pin). Then, the first delay model unit 140 generates a first compensated clock signal ICLK1 based on the estimated delay amount.

The first direct phase detector 150 outputs the first comparative signal PD1 to the delay line unit 120 after comparing the external clock signal EXT_CLK with the first compensated clock signal ICLK1.

The second delay model unit 160 receives the second mixed clock signal INTCLK2 and estimates a delay amount generated while the second mixed clock signal INTCLK2 travels to a data input-output pin (DQ pin). Then, the second delay model unit 160 generates a second compensated clock signal ICLK2.

However, the conventional DLL device has a power consuming problem because two phase mixers (not shown), the two delay model units (140 and 160) and the two direct phase detectors (150 and 170) continue to operate after a delay value of the conventional DLL is locked. In addition, since both the two delay lines continue to operate after the DLL is locked, a total phase error of the DLL device is equal to a phase error of one of the two delay lines.

SUMMARY OF INVENTION

It is, therefore, an object of the present invention to provide a DLL device that consumes less power, and has low jitter characteristic.

In accordance with an aspect of the present invention, there is provided a DLL device including a first delay line for receiving an external clock signal and a first delay control signal to generate a first internal clock signal; a second delay line for receiving the external clock signal and a second delay control signal or the first delay control signal to generate a second internal clock signal; a first delay control block for receiving the external clock signal to generate the first delay control signal; a second delay control block for receiving the external clock signal to generate the second delay control signal; and a phase detecting block for receiving the first internal clock signal and the second internal clock signal to generate the on-off signal by comparing a phase of the first internal clock signal with a phase of the second internal clock signal.

BRIEF DESCRIPTION OF THE DRAWINGS

The above and other objects and features of the present invention will become apparent from the following description of preferred embodiments taken in conjunction with the accompanying drawings, in which:

FIGS. 5A and 5B show sample processes of controlling the delay lines shown in FIG. 4.

DETAILED DESCRIPTION OF INVENTION

Hereinafter, a delay locked loop (DLL) device in accordance with the present invention will be described in detail referring to the accompanying drawings.

Figure 1:
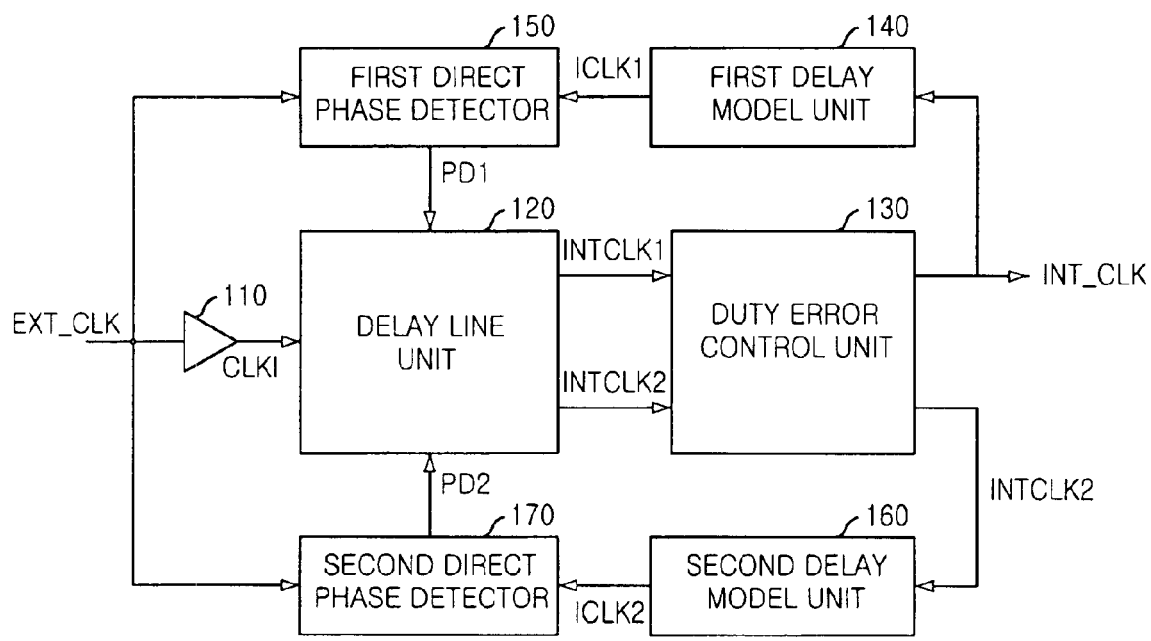
FIG. 1 is a block diagram showing a conventional delay locked loop (DLL) device.
Figure 2:
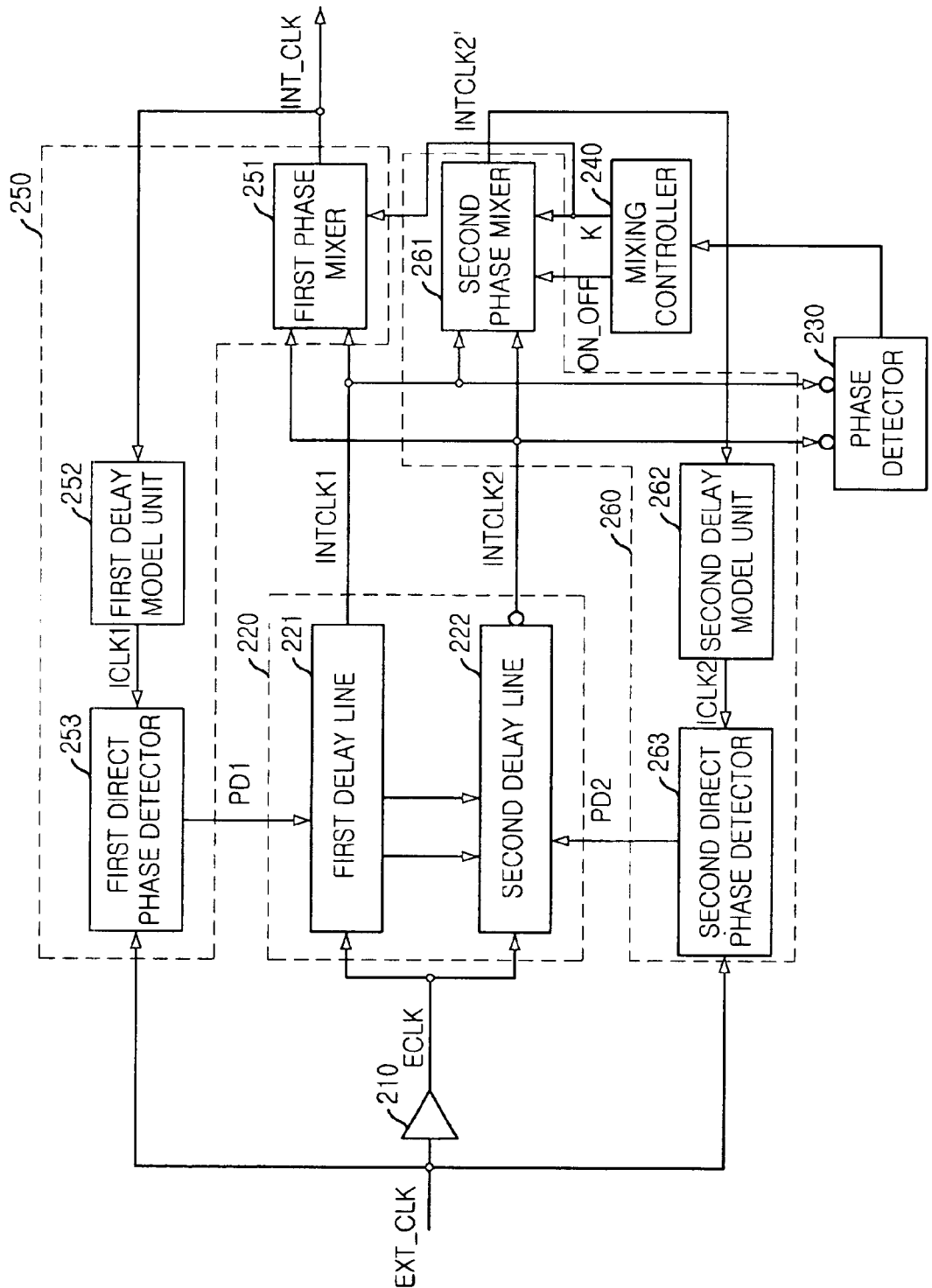
FIG. 2 is a block diagram showing a DLL device in accordance with the present invention.

FIG. 2 is a block diagram showing the DLL device in accordance with the present invention.

As shown, the DLL device includes a buffer 210, a delay line unit 220, a phase detector 230, a mixing controller 240, a first delay control block 250 and a second delay control block 260.

The buffer 210 receives an external clock signal EXT_CLK to output an input clock signal ECLK to the delay line unit 220.

The delay line unit 220 includes a first delay line 221 and a second delay line 222. The 220 receives the input clock signal ECLK from the buffer 210, a first comparative signal PD1 from the first delay control block 250 and a second comparative signal PD2 from the second delay control block 260.

The first delay line 221 included in the delay line unit 220 receives the input clock signal ECLK and the first comparative signal PD1; and, then, the first delay line 221 delays the input clock signal ECLK depending on the first comparative signal PD1 to output a first clock signal INTCLK1 to the first delay control block 250.

The second delay line 222 included in the delay line unit 220 receives the input clock signal ECLK and the second comparative signal PD2; and, then, the second delay line 222 delays and inverts the clock input signal ECLK depending on the second comparative signal PD2 to output a second clock signal INTCLK2 to the second delay control block 260.

The phase detector 230 receives the first clock signal INTCLK1 and the second clock signal INTCLK2 from the delay line unit 220. Then, the phase detector 230 generates a phase detecting signal, where the phase detecting signal indicates which of the two falling edges of the first clock signal INTCLK1 and the second clock signal INTCLK2 leads; and, then, the phase detecting signal is inputted to the mixing controller 240.

The mixing controller 240 determines whether the DLL is locked or not, and outputs a weight value K to the first delay control block 250 and the second delay control block 260. The mixing controller 240 also generates an on-off signal ON_OFF which is determined by whether the DLL is lock or not, and outputs the on-off signal ON_OFF to the second delay control block 260. The weight value K is determined by the phase detecting signal.

The first phase mixer 251 included in the first delay control block 250 generates a first mixed clock signal INT_CLK after adjusting duties of the first and second clock signals INTCLK1 and INTCLK2 by applying the weight value 1-K to the first clock signal INTCLK1 and the weight value K to the second clock signal INTCLK2.

The first delay model 252 included in the first delay control block 250 receives the first mixed clock signal INT_CLK from the first phase mixer 251 to generate the first compensated clock signal ICLK1 after compensating time difference between the external clock signal EXT_CLK and the first mixed clock signal INT_CLK.

The first direct phase detector 253 included in the first delay control block 250 receives the external clock signal EXT_CLK and the first compensated clock signal ICLK1, and generates the first comparative signal PD1 after comparing the external clock signal EXT_CLK with the first compensated clock signal ICLK1.

The second delay control block 260 generates a second compensated clock signal ICLK2 from the received signals, the weight value K, the first clock signal INTCLK1 and the second clock signal INTCLK2. The second delay control block 260 also receives the external clock signal EXT_CLK, and generates the second comparative signal PD2 after comparing the external clock signal EXT_CLK with the second compensated clock signal ICLK2. The second delay control block 260 becomes activated or inactivated depending on the on-off signal ON_OFF.

The second phase mixer 261 included in the second delay control block 260 generates a second mixed clock signal INTCLK2' after adjusting duties of the first and second clock signals INTCLK1 and INTCLK2 by applying the weight value K to the first clock signal INTCLK1 and the weight value 1-K to the second clock signal INTCLK2. The second phase mixer 261 becomes enabled or disabled depending on the on-off signal ON_OFF.

The second delay model unit 262 included in the second delay control block 260 receives the second mixed clock signal INTCLK2' from the second phase mixer 261, and generates the second compensated clock signal ICLK2 after compensating time difference between the external clock signal EXT_CLK and the second mixed clock signal INTCLK2'. The second delay model unit 262 becomes enabled or disabled depending on the on-off signal ON_OFF.

The second direct phase detector 263 included in the second delay control block 260 receives the external clock signal EXT_CLK and the second compensated clock signal ICLK2, and generates the second comparative signal PD2 after comparing the external clock signal EXT_CLK with the first compensated clock signal ICLK1. The second direct phase detector 263 becomes enabled or disabled depending on the on-off signal ON_OFF.

Figure 3:
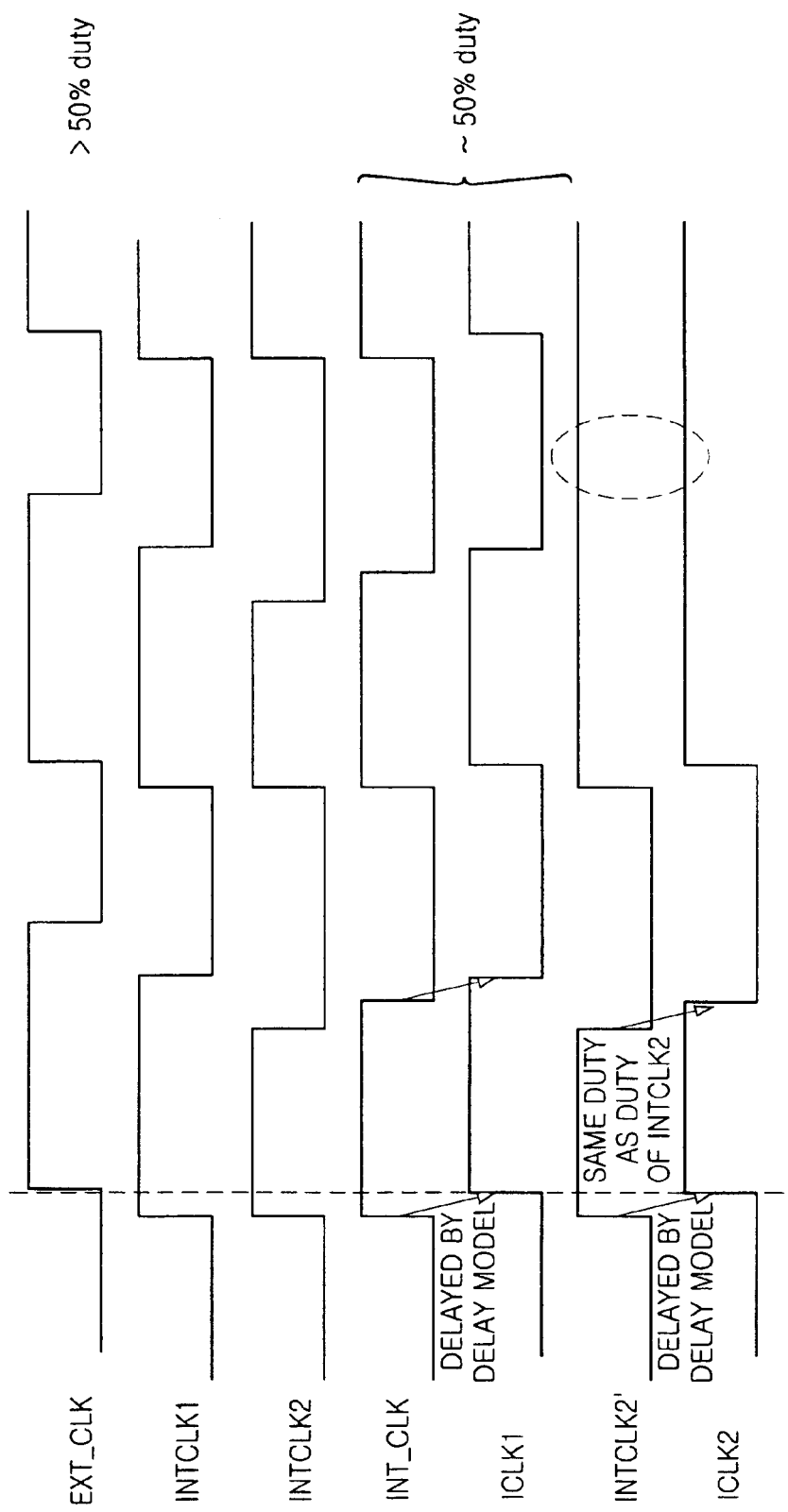
FIG. 3 is a timing diagram showing an operation of the DLL device in accordance with the present invention.

FIG. 3 is a timing diagram showing an operation of the DLL device in accordance with the present invention.

If the DLL is locked, rising edges of the first compensated clock signal ICLK1 and the second compensated clock signal ICLK2 become in phase; and, rising edges of the first clock signal INTCLK1, the second clock signal INTCLK2, the first mixed clock signal INT_CLK and the second mixed clock signal INTCLK2' become in phase. Herein, if the DLL is locked, the second direct phase detector 263 is turned off, and only the first direct phase detector 253 controls both the first delay line 221 and the second delay line 222 included in the delay line unit 220.

For example, if a rising edge of the first mixed clock signal INT_CLK lags behind a rising edge of the external clock signal EXT_CLK, the first direct phase detector 253 commands the first delay line 221 and the second delay line 222 to reduce delay quantity. Therefore, rising edges of the fist clock signal INTCLK1 and the second clock signal INTCLK2 are advanced; and, consequently, the rising edge of the first mixed clock signal INT_CLK is also advanced.

Therefore, when the DLL device starts to operate, both the first delay line 221 and the second delay line 222 operate being controlled by the first direct phase detector 253 and the second direct phase detector 263. However, once the DLL is locked, only the first direct phase detector 253 operates controlling both the first delay line 221 and the second delay line 222.

Therefore, the second phase mixer 261, the second delay model unit 262 and the second direct phase detector 263 can be turned off, and the DLL device can save power.

Figure 4:
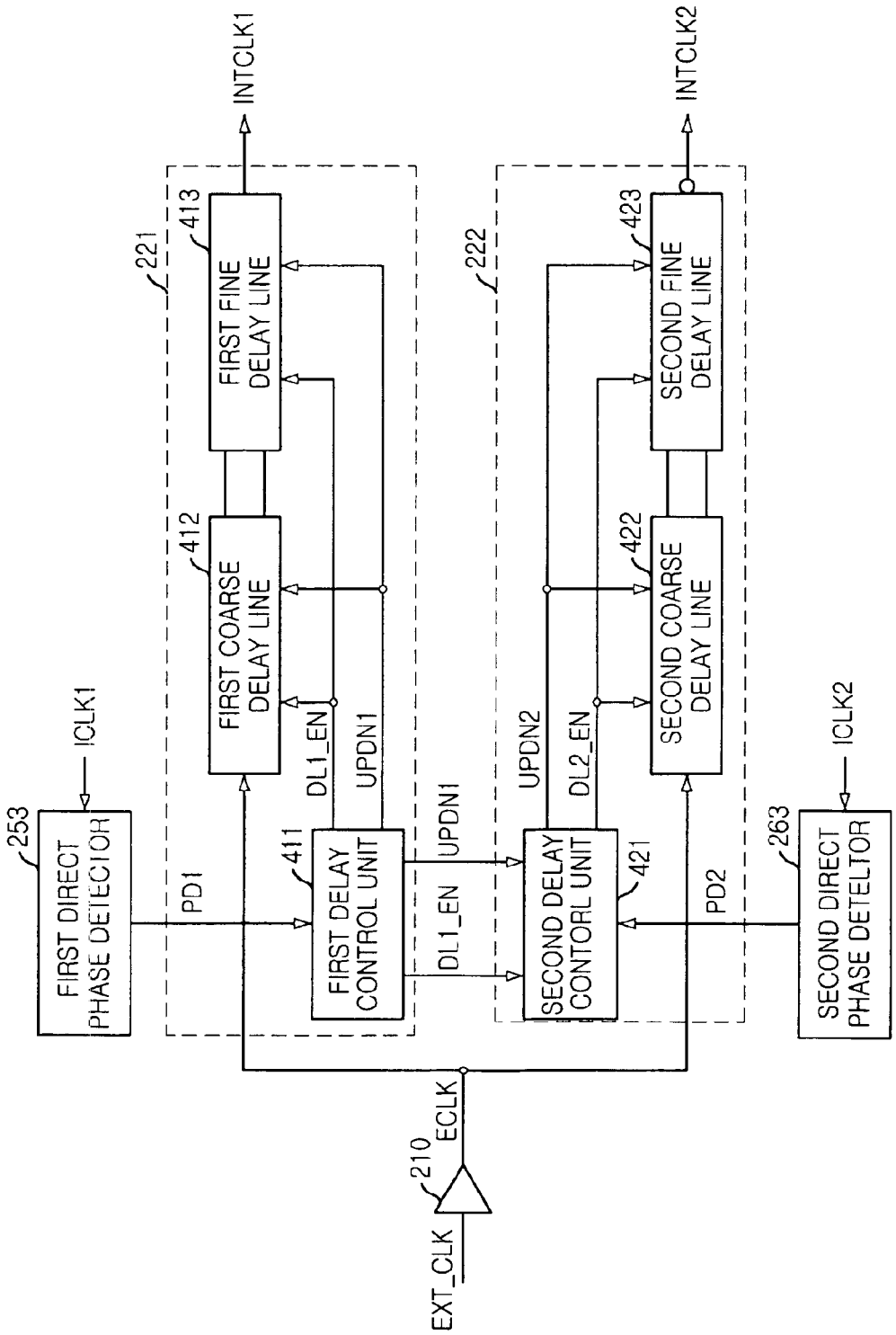
FIG. 4 is a block diagram showing delay lines included in the DLL device in accordance with the present invention.

FIG. 4 is a block diagram of the first delay line 221 and the second delay line 222.

A first delay control unit 411 included in the first delay line 221 receives the first comparative signal PD1 from the first direct phase detector 253, and generates a first delay control signal UPDN1 and a first delay enable signal DL1_EN.

A first coarse delay line 412 included in the first delay line 221 is activated by the first delay enable signal DL1_EN, and controls delay of the clock input signal ECLK depending on the first delay control signal UPDN1.

A first fine delay line 413 included in the first delay line 221 is activated by the first delay enable signal DL1_EN, and generates the first clock signal INTCLK1 by delaying an outputted signal from the first coarse delay line 412 depending on the first delay control signal UPDN1.

A second delay control unit 421 included in the second delay line 222 receives the second comparative signal PD2 from the second direct phase detector 263, and generates a second delay control signal UPDN2 and a second delay enable signal DL2_EN. If the DLL is locked, the second delay control unit 421 receives the first delay enable signal DL1_EN and the first delay control signal UPDN1 from the first delay control unit 411, and outputs the second delay enable signal DL2_EN and the second delay control signal UPDN2.

A second coarse delay line 422 included in the second delay line 222 is activated by the second delay enable signal DL2_EN, and controls delay of the clock input signal ECLK depending on the second delay control signal UPDN2.

A second fine delay line 423 included in the second delay line 222 is activated by the second delay enable signal DL2_EN, and generates the second clock signal INTCLK2 by delaying an outputted signal from the second coarse delay line 422 depending on the second delay control signal UPDN2.

The following Table. 1 shows operation of the first delay line 221 and the second delay line 222.

Each of the first delay line 221 and the second delay line 222 has a phase step size, where the phase step size is the minimum size the two delay lines 221 and 222 can tune delay, i.e., the two delay lines 221 and 222 can not delay a clock signal less than the phase step size.

If the phase step size is TUD, each of the first delay line 221 and the second delay line 222 has a phase error of ±TUD.

Therefore, if both the first delay line 221 and the second delay line 222 operate simultaneously, the first mixed clock signal INT_CLK has a phase error of ±TUD at the worst case.

However, if the two delay lines operate by turns, the first mixed clock signal INT_CLK has a phase error of ±TUD/2 at the worst case. Therefore, the low jitter characteristic can be achieved.

Figure 5B:
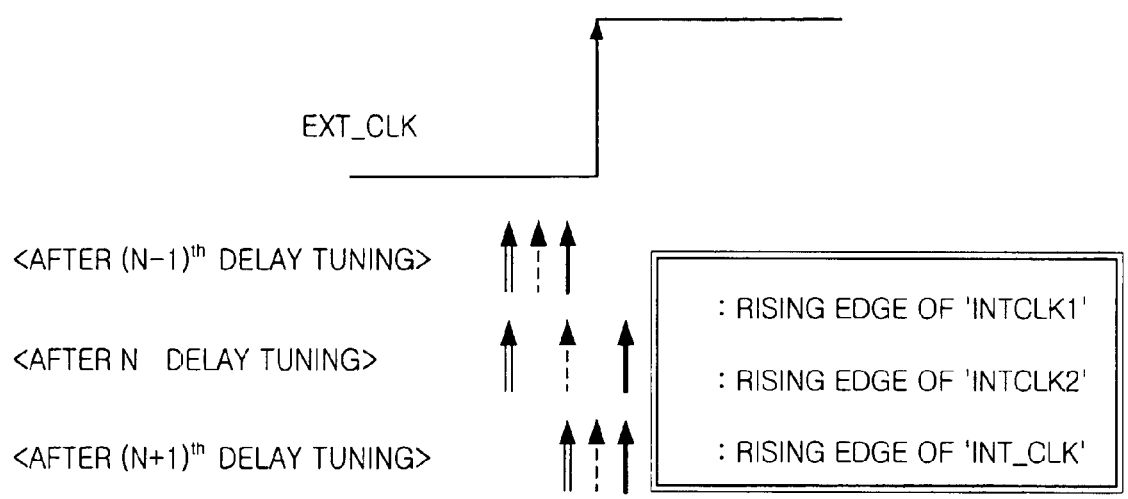

FIGS. 5A and 5B show sample processes of controlling the two delay line, the first delay line 221 and the second delay line 222, after the DLL is locked.

TABLE 1

|  | Previous first comparative signal PD1 | Current first comparative signal PD1 | Second comparative signal PD2 | First delay enable signal DL1_EN | Second delay enable signal DL2_EN | First delay control signal UPDN1 | Second delay control signal UPDN2 |
|---|---|---|---|---|---|---|---|
| Before the DLL is locked | x | First value | Second value | Logic High | Logic High | First value | Second value |
| After the DLL is locked |  | Previous first comparative signal = current first comparative signal /Previous first comparative signal = current first comparative signal | x |  | Previously logic Low signal becomes logic High Previously logic High signal becomes logic High | Current first comparative signal PD1 | Current first comparative signal PD1 |

The first delay enable signal DL1_EN controls the first delay line 221 to operate delay tuning, and the second delay enable signal DL2_EN controls the second delay line 222 to operate delay tuning.

After the DLL device is locked, one of the first enable signal DL1_EN and the second enable signal DL2_EN becomes a logic 'HIGH' level depending on values of a previous first comparative signal PD1 and a current first comparative signal PD1. If the current first comparative signal PD1 is an Nth outputted signal, the previous first comparative signal PD1 is an (N-1)th outputted signal, where N is a natural number bigger than one. If the current first comparative signal PD1 is equal to the previous first comparative signal PD1, one of the first delay enable signal DL1_EN and the second delay enable signal DL2_EN becomes a logic 'HIGH' level and the other signal becomes a logic 'LOW' level, wherein a previous state of the signal which changed as a logic 'HIGH' level is a logic 'LOW' level. If the current first comparative signal PD1 is different from the previous first comparative signal PD1, previous values of the first delay signal DL1_EN and the second delay signal DL2_EN become current values, i.e., previously logic 'HIGH' level signal becomes a logic 'HIGH' level, and previously logic 'LOW' signal becomes a logic 'LOW' level.

Therefore, it is possible to synchronize the first clock signal INTCLK1 with the second clock signal INTCLK2 by using the above method.

Low jitter characteristic is also achieved by using the above method, and the reason why is described below.

Referring to FIG. 5A, if a rising edge of the first mixed clock signal INT_CLK leads a rising edge of the external clock signal EXT_CLK after the (N-1)th delay tuning, the first comparative signal PD1 commands a more delay. By the command of the first comparative signal PD1, the second clock signal INTCLK2 is delayed for tUD, where tUD is a phase step size that the first fine delay line 413 and the second fine delay line 423 have. Thereafter, if a rising edge of the first mixed clock signal INT_CLK lags behind a rising edge of the external clock signal EXT_CLK after the Nth delay tuning, the first comparative signal PD1 commands a less delay. Because the current first comparative signal PD1 is different from the previous first comparative signal PD1, the second clock signal INTCLK2 is controlled by the command again.

Referring to FIG. 5B, if a rising edge of the first mixed clock signal INT_CLK leads a rising edge of the external clock signal EXT_CLK after the (N-1)th delay tuning, the first comparative signal PD1 commands a more delay. By the command of the first comparative signal PD1, the second clock signal INTCLK2 is delayed for tUD. However, in this case, a rising edge of the first clock signal INT_CLK still leads a rising edge of the external clock signal EXT_CLK after the Nth delay. Therefore, the first comparative signal commands a more delay again. Because, in this case, the current first comparative signal PD1 is equal to the previous first comparative signal PD1, the first INTCLK1 is controlled by the command.

While the present invention has been described with respect to the particular embodiments, it will be apparent to those skilled in the art that various changes and modifications may be made without departing from the spirit and scope of the invention as defined in the following claims.

What is claimed is:

1. A delay locked loop device comprising:
   a first delay line for receiving an external clock signal and a first comparative signal to generate a first internal clock signal;
   a second delay line for receiving the external clock signal and a second comparative signal or a first delay control signal to generate a second internal clock signal;
   a first delay control block for receiving the external clock signal to generate a first duty controlled internal clock signal;
   a second delay control block for receiving the external clock signal to generate a second duty controlled internal clock signal; and
   a phase detecting block for receiving the first internal clock signal and the second internal clock signal to generate the on-off signal by comparing a phase of the first internal clock signal with a phase of the second internal clock signal.

2. The delay locked loop device as recited in claim 1, wherein the second delay control block is disabled in response to the on-off signal when the delay locked loop device is locked.

3. The delay locked loop device as recited in claim 1, wherein the phase detecting block generates a weight signal in response to the first internal clock signal and the second internal clock signal.

4. The delay locked loop device as recited in claim 3, wherein the first delay control block generates the first duty controlled internal clock signal in response to the first internal clock signal, the second internal clock signal and the weight signal.

5. The delay locked loop device as recited in claim 4, wherein the second delay control block generates the second duty controlled internal clock signal in response to the first internal clock signal, the second internal clock signal and the weight signal.

6. The delay locked loop device as recited in claim 1, wherein the second delay line includes a second delay line control unit for receiving the first delay control signal or the second comparative signal to generate a second delay control signal and a second delay enable signal.

7. The delay locked loop device as recited in claim 6, wherein the second delay line further includes:
   a coarse delay line for coarsely delaying the external clock signal in response to the second delay control signal and the second delay enable signal; and
   a fine delay line for finely delaying the coarsely delayed external clock signal in response to the second delay control signal and the second delay enable signal to generate the second internal clock signal.

8. The delay locked loop device as recited in claim 1, wherein the first delay line includes a first delay line control unit for receiving the first comparative signal to generate a first delay enable signal and a first delay delay control signal and to provide the first delay control signal to the second delay line when the delay locked loop device is locked.

9. The delay locked loop device as recited in claim 8, wherein the first delay line further includes:
   a coarse delay line for coarsely delaying the external clock signal in response to the first delay enable signal and a first delay control signal; and
   a fine delay line for finely delaying the coarsely delayed external clock signal in response to the first delay enable signal and a first delay control signal to generate the first internal clock signal.

10. The delay locked loop device as recited in claim 5, wherein the second delay control block includes:
    a direct phase detector for receiving the external clock signal and a delay modeled internal signal to generate the second comparative signal;
    a delay model for receiving the second duty controlled internal clock signal to generate the delay modeled internal signal by delaying the second duty controlled internal clock signal during a predetermined modeled delay time; and
    a phase mixer for receiving the first internal clock signal, the second internal clock signal, the on-off signal and the weight signal to generate the second duty controlled internal clock signal.

11. The delay locked loop device as recited in claim 5, wherein the first delay control block includes:
    a direct phase detector for receiving the external clock signal and a delay modeled internal signal to generate the first comparative signal;
    a delay model for receiving the first duty controlled internal clock signal to generate the delay modeled internal signal by delaying the first duty controlled internal clock signal during a predetermined modeled delay time; and
    a phase mixer for receiving the first internal clock signal, the second internal clock signal and the weight signal to generate the first duty controlled internal clock signal.

12. The delay locked loop device as recited in claim 3, wherein the phase detecting block includes:
    a mixer controller for generating the on-off signal and the weight signal in response to a phase detecting signal; and
    a phase detector for generating the phase detecting signal in response to the first internal clock signal and the second internal clock signal by comparing the phase of the first internal clock signal with the phase of the second internal clock signal.

* * * * *